United States Patent [19]

Lee

[11] Patent Number: 5,686,560

[45] Date of Patent: Nov. 11, 1997

[54] POLYQUINAZOLINES AND METHODS FOR THEIR PREPARATION

[75] Inventor: Virgil J. Lee, La Verne, Calif.

[73] Assignee: Hitachi Chemical Co., Ltd., Tokyo, Japan

[21] Appl. No.: 467,069

[22] Filed: Jun. 6, 1995

[51] Int. Cl.$^6$ .................................................. C08G 73/00
[52] U.S. Cl. .................. 528/422; 528/367; 528/368; 528/369; 528/423; 528/491; 528/503
[58] Field of Search .......................... 528/422, 367, 528/368, 369, 423, 491, 503

[56] References Cited

U.S. PATENT DOCUMENTS

| | | | |
|---|---|---|---|
| 3,826,783 | 7/1974 | Bloch | 260/47 |
| 3,956,266 | 5/1976 | Mory et al. | 106/23 |
| 4,012,371 | 3/1977 | Rouëche et al. | 106/28 |
| 5,247,050 | 9/1993 | Hendricks | 528/125 |

OTHER PUBLICATIONS

Hedrick et al., "Poly(aryl ether–phenylquinoxalines)," *Macromolecules*, vol. 23, No. 6, Mar. 1990, pp. 1561–1568.
Mani et al., "Poly(aryl ether ketone) synthesis via competing $S_NAR$ and $S_{RN}1$ reactions: 1. Polymers derived from 1,3-bis(p–chlorobenzoyl)benzene and 1,3-bis(p–fluorobenzoyl)benzene with hydroquinone and 4,4'–isopropylidenediphenol," *Polymer*, 1993, vol. 34, No. 1, pp. 171–181.

*Primary Examiner*—Nathan M. Nutter
*Assistant Examiner*—Duc Truong
*Attorney, Agent, or Firm*—Antonelli, Terry, Stout & Kraus, LLP.

[57] ABSTRACT

New polyquinazoline polymers are provided by reacting novel monomers. The polymers incorporate repeat units that have at least one quinazoline nucleus and at least one ether linkage at the quniazoline 2 or 4 position. The quinazoline polymers are prepared by treating a monomer which comprises a quinazolone nucleus having one activated halide group with a base in a dipolar solvent to thereby form the polyquinazoline polymer.

7 Claims, 3 Drawing Sheets

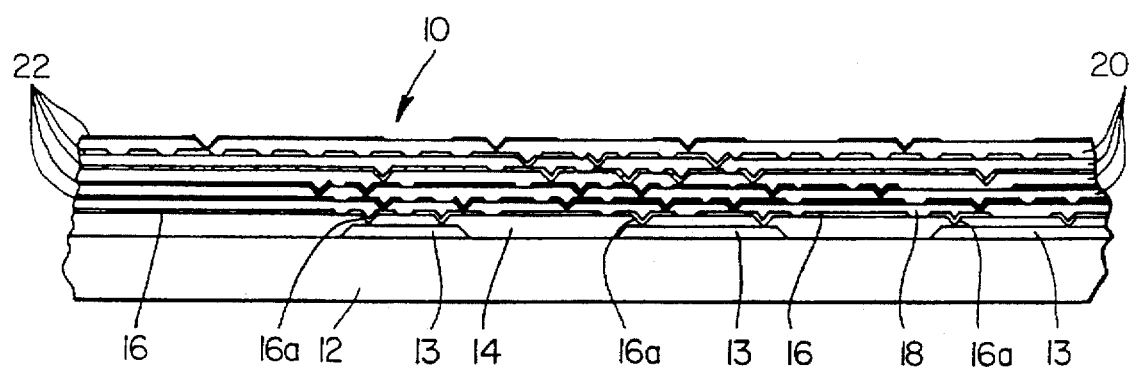

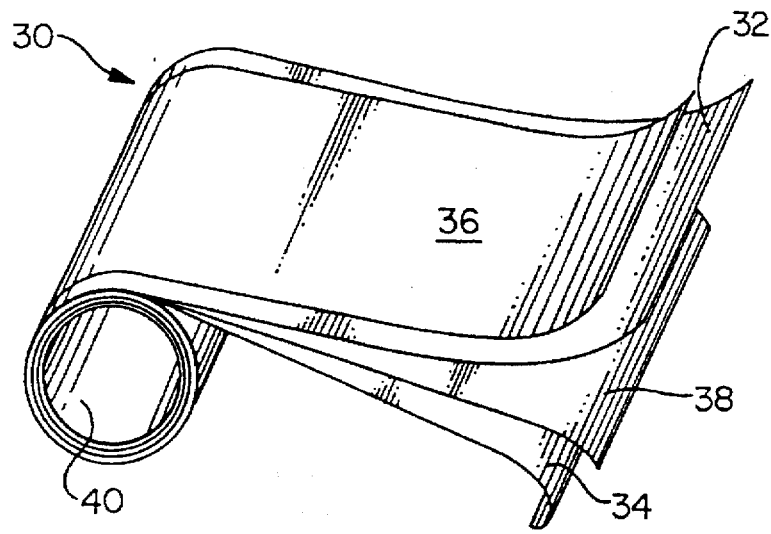
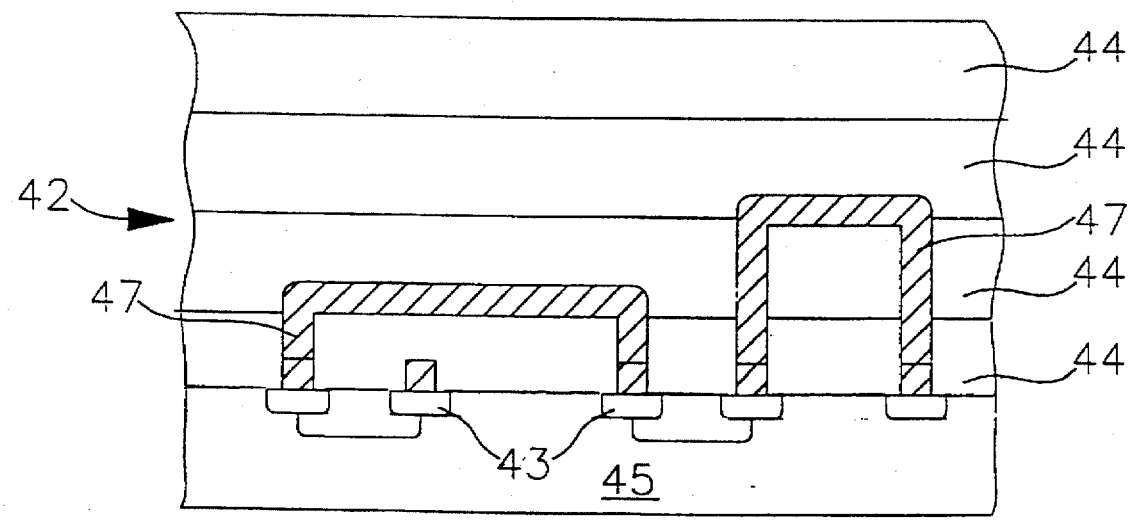

POLYQUINAZOLINES AND METHODS FOR THEIR PREPARATION

FIELD OF THE INVENTION

This invention relates to new methods for preparing polyquinazoline polymers and to the polymers themselves.

BACKGROUND OF THE INVENTION

Polyquinazoline polymers are useful in a broad range of electronics and microelectronics applications, including planarizing dielectric layers in integrated circuit manufacture, passivation layers, as protective coatings and potting compounds, as adhesives, as resins for printed wiring board fabrication, as dielectric materials, in coating applications for liquid crystal displays, flat panel television, solar windows, and the like, as fibers, and as high-strength films.

Methods of preparing polyquinazolines by condensation of nitriles with chloroimines are disclosed in U.S. Pat. No. 3,826,783 which issued to B. M. Bloch on Jul. 30, 1974. The polyquinazolines disclosed by Bloch are characterized by linkages at the 2 or 4 positions of the quinazoline which are either direct, or made through an arylene, alkylene, or alkarylene group.

Many classes of polyheterocycles containing ether linkages are known; the ether linkage providing processability, good thermal, mechanical, and electrical properties, and general ease of synthesis. However, polyquinazolines containing ether linkages at the quinazoline 2, or 4 position have not been reported.

It is desired to provide polyquinazolines having ether linkages at the quinazoline 2 or 4 position, derived from relatively low cost starting materials, which are processable and have good thermal, mechanical and electrical properties.

SUMMARY OF THE INVENTION

The present invention provides new and economical methods for forming polyquinazoline polymers and the polymers themselves.

In a preferred embodiment, the method for forming the polyquinazoline polymers of the present invention comprises treating a monomer comprising a quinazolone nucleus having one activated halide group with a base in a dipolar solvent to thereby form said polyquinazoline polymer.

In another embodiment, the method for forming the polyquinazoline polymers of the present invention comprises the steps of:

a) providing a bis-quinazolone monomer, present as its bis-oxide salt (bis-anion) or in the presence of a base capable of deprotonating the quinazolone groups, b) providing a second electrophilic monomer prone to nucleophilic substitution at two sites, and c) allowing the bis-quinazolone monomer and the second monomer to react in a dipolar solvent to thereby form the polyquinazoline polymer.

In yet another embodiment, the method for forming the polyquinazoline polymers of the present invention comprises providing mixtures of monomers having either a quinazolone nucleus having one activated halide group, and/or bis-quinazolones, to form polyquinazoline co-polymers.

In another aspect of the present invention, a polyquinazoline polymer is provided which comprises repeat units comprising at least one quinazoline nucleus and at least one ether linkage.

In yet another aspect of the present invention, multi-chip modules, capacitors, integrated circuits, films, and fibers formed from the polymers provided in accordance with practice of the present invention are provided.

BRIEF DESCRIPTION OF THE DRAWINGS

These and other features, aspects and advantages of the present invention will be more fully understood when considered with respect to the following detailed description, appended claims, and accompanying drawings, wherein:

FIG. 1 is a semi-schematic fragmentary cross sectional side view of a multi-chip module provided in accordance with practice of the present invention.

FIG. 2 is a semi-schematic exploded perspective view of a capacitor provided in accordance with the present invention;

FIG. 3 semi-schematic cross-sectional side view of an integrated circuit provided in accordance with practice of the present invention;

DETAILED DESCRIPTION

Figure 4:
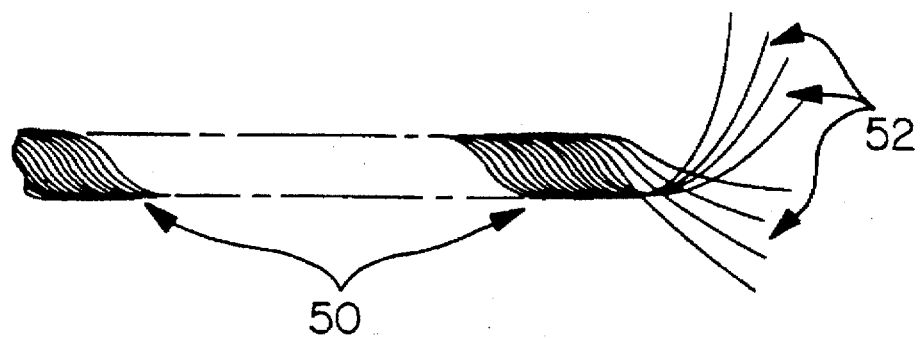
FIG. 4 is a semi-schematic perspective view of a multi-filament fiber provided in accordance with practice of the present invention.

This invention is directed to a new class of polyquinazoline polymers, to the monomers which are used for their preparation, to various products formed from the polymers, and to the processes for forming the polymers.

The polymers provided in accordance with practice of the present invention can be formed from a single monomer containing one each of two functional group types, typically called an AB monomer, or from two monomers, each containing two of the same functional groups, typically called type AA and type BB monomers. The terms "type AA monomer," "type BB monomer," and "type AB monomer" are commonly used for describing monomers used in condensation polymerization systems. For example, one such system is described in U.S. Pat. No. 4,000,187, which is directed to the use of Friedlander reactions to prepare polyquinolines by reacting an aromatic amino carbonyl compound containing two sets of ortho-amino aldehyde or ortho-amino ketone functions (in this case, the AA monomer) with a monomer containing two ketone functions having a methylene group adjacent each function (in this case, the BB monomer).

The polyquinazoline homopolymers of the present invention are prepared either from two monomers, i.e., from a type AA monomer and a type BB monomer, or from a single type AB monomer. Polyquinazoline copolymers are prepared from mixtures of two or more type AA monomers with one or more type BB monomers; or one or more type AB monomers with one or more type AA, or one or more type BB monomers; or two or more different AB monomers.

The type AA monomer of the present invention is a bis-quinazolone in which each quinazolone nucleus may be deprotonated to form a nucleophilic oxy anion. As is known in the art, quinazolones exist in two isomeric forms, one bearing a proton on the oxygen atom and the other bearing a proton on the nitrogen atom. Treatment of quinazolones with a base will abstract this labile proton and produce a quinazolone anion, where the negative charge is delocalized between the oxygen and nitrogen atoms. In the present invention the quinazolone anion reacts through the oxygen atom, and the quinazolone anion therefore reacts as a nucleophilic oxy anion. The type BB monomer of the present invention comprises a bis-electrophile, in which each electrophilic group has a leaving group that can be displaced by the quinolone anion. The BB monomers of the present invention are prone to nucleophilic substitution at two sites. Electrophilic groups are typically aryl halides having an electron withdrawing group situated ortho or para to the halide. Electron withdrawing groups useful for the practice of the present invention include, but are not limited to carbonyl, sulfone, nitro, quinoline, quinazolone, and quinazoline. The polyquinazolines of the present invention are formed by allowing the bis-nucleophilic AA monomer to react with the bis-electrophilic BB monomer in a dipolar solvent under conditions where the AA monomer is partially or totally deprotonated.

The type AB monomers of the present invention contain both nucleophilic and electrophilic groups. The AB monomers are comprised of a quinazolone nucleus containing a single activated halide group. The nucleophilic group is the oxy anion of the deprotonated quinazolone. The electrophilic group is the haloquinazolone (or halo quinazoline in the growing polymer chain) and the leaving group is the activated halide. The AB monomers are reacted in the presence of a base in a dipolar solvent.

The general structure of AB type monomers provided in accordance with the present invention is:

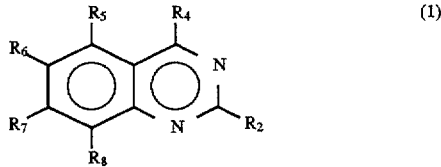

where one of $R_2$ and $R_4$ is OH, and one of $R_2$, $R_4$, $R_5$, and $R_7$ is a halide selected from the group consisting of halide, ortho-arylhalide, and para-arylhalide, where aryl may be heteroaryl, or substituted aryl. The halide may be F, Cl, Br, or I, preferably, F, or Cl, and most preferably F. The remaining positions on the quinazolone nucleus may be H or may be substituted with any groups $(R)_n$, not interfering with the polymerization reaction, including, but not limited to, alkyl, aryl, substituted alkyl and aryl, fluoroalkyl, alkoxy, aryloxy, thioether, ketone, aldehyde, C or O bound ester, C or N bound amide, imide, carboxylic acid, sulfone, cyano (—CN), nitro, and amine.

Non-limiting examples of (AB) monomers useful for practice of the present invention are 2-(4-fluorophenyl)-4-quinazolone, 2-(2-fluorophenyl)-4-quinazolone, 2-(4-chlorophenyl)-4-quinazolone, 2-(2-chlorophenyl)-4-quinazolone, 4-(4-fluorophenyl)-2-quinazolone, 4-(2-fluorophenyl)-2-quinazolone, 4-(4-chlorophenyl)-2-quinazolone, and 4-(2-chlorophenyl)-2-quinazolone, 5-fluoro-2-quinazolone, 7-fluoro-2-quinazolone, 5-fluoro-4-quinazolone, 7-fluoro-4-quinazolone, 5-chloro-2-quinazolone, 7-chloro-2-quinazolone, 5-chloro-4-quinazolone, and 7-chloro-4-quinazolone.

The general structure of the bis-quinazolone (AA) monomers useful in accordance with practice of the present invention which contain two quinazoline nuclei is given by the following general structural formula:

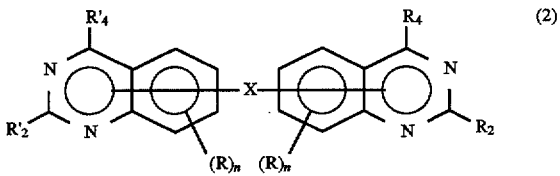

where either $R_2$ and $R'_2$, or $R_4$ and $R'_4$ are OH, and the remaining positions on the quinazolone nuclei may be H or may be substituted with any groups $(R)_n$ not interfering with the polymerization reaction, including, but not limited to, alkyl, aryl, substituted alkyl and aryl, fluoroalkyl, alkoxy, aryloxy, thioether, ketone, aldehyde, C or O bound ester, C or N bound amide, imide, carboxylic acid, sulfone, cyano (—CN), nitro, and amine; and X is a divalent group selected from the group consisting of nil, alkylene, arylene, and —O—, where arylene may be monocyclic or polycyclic, single, multi-ring, or fused ring divalent aryl groups, including, but not limited to phenylene, biphenylene, diphenylether, diphenylamine, benzophenone, naphthalenediyl, fluorenediyl, and the like, and wherein non-limiting examples of alkylene are ethylene (—CH$_2$CH$_2$—), propylene (—CH$_2$CH$_2$CH$_2$—), 1,4-butylene, and 1,2-propylene.

Non-limiting examples of R groups described above are as follows:

alkyl groups are methyl, ethyl, propyl, isopropyl, tert-butyl, cyclohexyl, stearyl, and docosyl (—CH$_2$(CH$_2$)$_{20}$CH$_3$);

aryl groups are phenyl, biphenyl, naphthyl, anthracenyl, and diphenylphenyl;

C bound amides are N,N-dimethylaminocarbonyl (—CON(CH$_3$)$_2$), N,N-diphenylaminocarbonyl, piperidinecarbonyl (—CONCH$_2$CH$_2$CH$_2$CH$_2$CH$_2$), morpholinecarbonyl (—CONCH$_2$CH$_2$OCH$_2$CH$_2$), and N-methyl-N-phenylaminocarbonyl;

N bound amides are benzoylamino, N-methylacetylamino;

O bound esters are acetyloxy (—OCOCH$_3$) and benzoyloxy (—OCOC$_6$H$_5$);

C bound esters are methoxycarbonyl (—CO$_2$CH$_3$) and phenoxycarbonyl (—CO$_2$C$_6$H$_5$);

alkoxy groups are methoxy, neopentyloxy, and cyclohexyloxy;

aryloxy groups are phenoxy, naphthoxy, and biphenyloxy;

imides are phthalimide, succinimide, and glutarimide;

carboxylic acid groups are —COOH;

fluoroalkyl groups are trifluoromethyl, perfluorobutyl and 2,2,2-trifluoroethyl;

ketones are phenylketone (also called benzoyl), naphthylketone (naphthoyl), methylketone (acetyl), ethylketone (propionyl), tert-butylketone (pivaloyl), isobutylketone, trifluoromethylketone (trifluoroacetyl), methoxyethylketone, benzylketone, phenethylketone, 2,4,6-trimethylphenylketone, pyridinylketone (nicotinoyl), 2-quinolinoketone, and 2-thiopheneylketone; and aldehyde is —COH.

Non-limiting examples of (AA) monomers useful for practice of the present invention are 6,6'-bis-4-quinazolone, 6,6'-bis-2-phenyl-4-quinazolone, 6,6'-(1,4-phenylene)-bis-4-quinazolone, 6,6'-bis-7,8-benzo-4-quinazolone ($R_7$ and $R_8$ bridging), 2,2'-bis-4-quinazolone, 2,2'-(1,4-phenylene)-bis-4-quinazolone, 2,2'-(4,4'-biphenylene)-bis-4-quinazolone, 2,2'-bis-(1,4-tetramethylene)-4-quinazolone, and 2,2-bis-(4,4'-oxydiphenyl)-4-quinazolone, 6,6'-bis-2-quinazolone, 6,6'-bis-4-phenyl-2-quinazolone, 2,2'-(1,3-phenylene)-bis- 4-quinazolone, 6,6'-bis-7,8-benzo-2-quinazolone ($R_7$ and $R_8$ bridging), 7,7'-bis-4-quinazolone, 4,4'-(1,4-phenylene)-bis-2-quinazolone, 4,4'-(4,4'-biphenylene)-bis-2-quinazolone.

The general formula for the bis-electrophilic monomer is W—Y—W, where W is a halide and Y is a divalent aromatic moiety chosen from —Ar—, —Het—, and —Ar'—A—Ar'— where Ar is an aryl group activate by electron withdrawing groups such as imide, halide, ketone, and nitro, and —Het— is heteroaryl, Ar' is a divalent aryl group linked as an ortho-arylene or a para-arylene, and A is a divalent electron withdrawing group such as carbonyl, sulfone, 1,4-dicarbonylbenzene (—CO—$C_6H_4$—CO—), (—CO—$C_6H_4$—O—$C_6H_4$—CO—), and the like. A, Ar, and Ar' may be mononuclear, polynuclear, monocyclic, or polycyclic groups. Some specific examples of —Ar'—A—Ar'— are 4,4'-benzophenone, and 4,4'-phenylsulfone.

Non-limiting examples of bis-electrophilic (BB) monomers useful as monomers of the present invention are 4,4'-dichlorobenzophenone, 4,4'-difluorobenzophenone, 2,2'-difluorobenzophenone, 2,2'-dichlorobenzophenone, 4-chlorophenyl sulfone, and 6,6'-bis[2-(4-fluorophenyl)-4-phenylquinoline]:

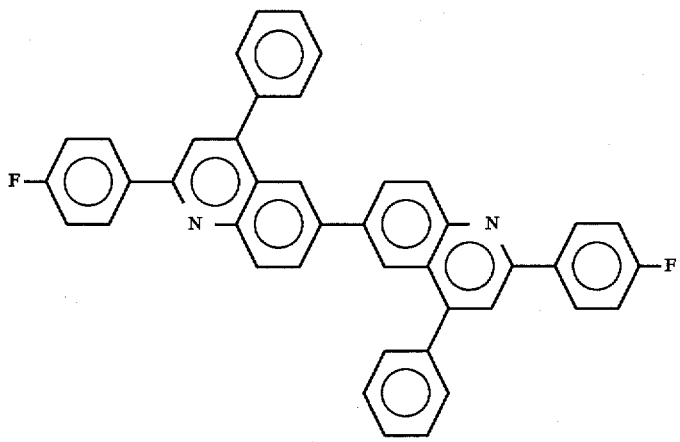

Other bis-electrophilic monomers will be apparent to one skilled in the art.

The general procedure for forming the polyquinazoline polymers of the present invention comprises heating the monomer(s) and a base in a solvent and azeotropically removing water (formed by the reaction of the base with the hydroxy groups on the AA or AB monomer). The order of addition of reactants is not important. The amounts of the monomers used to form the polymers of the present invention may be determined by standard formulae known in the art, such as Carother's equation.

In general, (for AA+BB polymerization) while equal molar amounts of AA and BB monomers are normally used, molar ratios other than 1:1 may be used, if desired, to control the MW or end groups. Base is generally added in slight molar excess. For the solvent system NMP/toluene the reflux temperature is about 135° C. (the particular temperature depends on the NMP/toluene ratio, with higher ratio giving higher temperature), and water is collected over a six to eighteen hour period. The toluene or other co-solvent is then removed by distillation and the mixture is heated to greater than about 175° C., (or brought to reflux, about 202° C. for NMP) and held for 12 to 24 hours (or longer at lower temperatures), or until the desired polymer MW is achieved. Pressure is not critical; atmospheric pressure is preferred.

Endcappers may be added at the beginning of the reaction, during the reaction, or near the end of the reaction. The polymer MW may be determined as is known in the art by measurement of viscosity or by gel permeation chromatography (size exclusion chromatography). The reaction is then cooled. The polymer may be recovered from the dope by any technique known in the art, including by precipitation with a non-solvent such as alcohol or water. The non-solvent is preferably chosen to be polar in order to remove fluoride salts which are the by-product of the reaction. It is also preferable to filter the polymer dope before precipitation. In some cases it may be desirable to dilute the dope before filtration or precipitation.

The AB monomer of general formula (1) may be polymerized to give polymers of the following general structures:

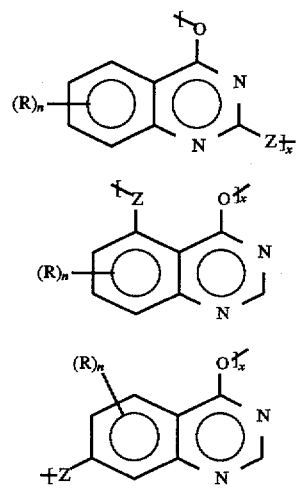

-continued

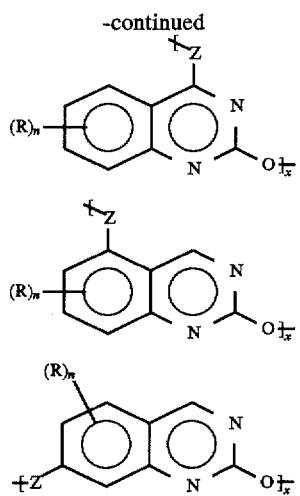

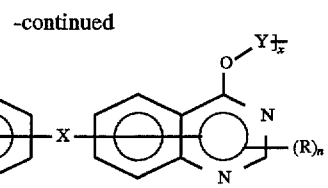

where X, and R are as above, and Y derives from the BB monomer and is as described above.

Exemplary polymers derived from AB monomers are shown below:

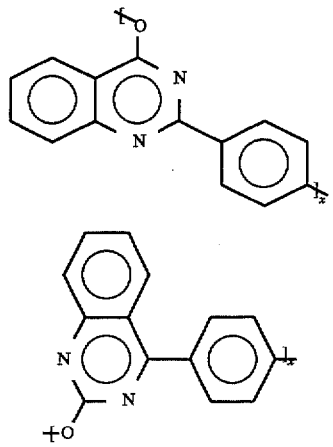

where Z is optionally substituted aryl or heteroaryl, or nil; x is the number of repeat units and is preferably from 2 to 1,000,000, more preferably from 10 to 10,000, and most preferably from 50 to 1000; the quinazoline groups may be optionally substituted with any groups $(R)_n$ not interfering with the polymerization reaction, including, but not limited to, alkyl, aryl, substituted alkyl and aryl, fluoroalkyl, alkoxy, aryloxy, thioether, ketone, aldehyde, C or O bound ester, C or N bound amide, imide, carboxylic acid, sulfone, cyano, nitro, and amine, and n may be 0 to 4. Examples of R groups of the AB monomers are the same as those set forth above for the AA monomers.

The AA monomer of general formula (2) may be polymerized with a bis-electrophilic type BB monomer to give polymers of the following general structures:

Exemplary polymers derived from AA monomers are shown below:

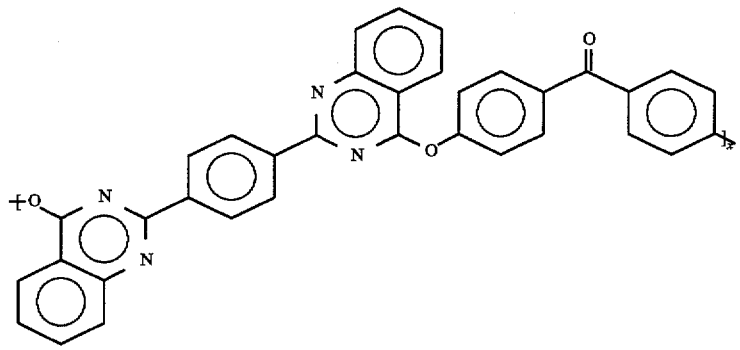

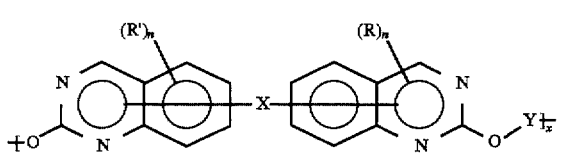

The following examples are illustrative of the present invention but are not considered limiting thereof in any way.

EXAMPLE 1

Preparation of 4-(4-Fluorophenyl)-2-quinazolone

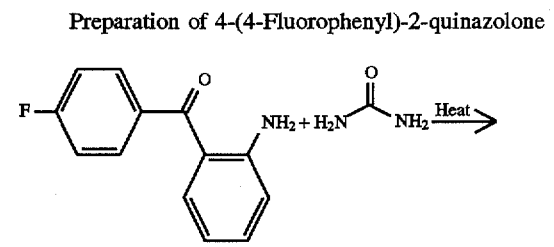

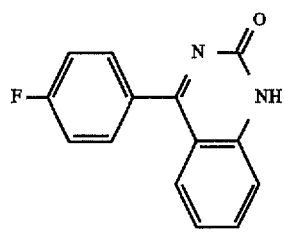

4'-Fluoro-2-aminobenzophenone (164.5 g, 1.20 mol) is heated with urea (72.09 g, 0.500 mol) at 195° C. (1 h) in NMP (500 mL). The solution is cooled and poured into water (2 L). The product is collected by filtration and dried. The product is purified by recrystallization.

EXAMPLE 2

Preparation of 1,4-bis(2,2'-Quinazolonyl)benzene

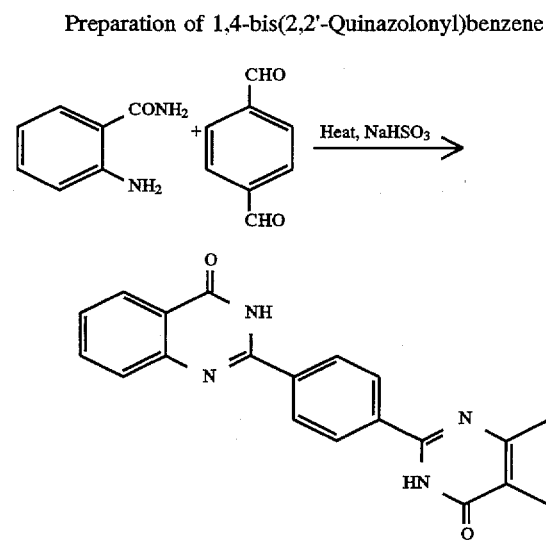

A mixture of 2-aminobenzamide (6.81 g, 50 mmol), terephthalaldehyde (6.71 g, 50 mmol), sodium bisulfite (15.6 g, 150 mmol) and dimethylacetamide (50 mL) is stirred at 150° C. (4 h). The mixture is then poured into water (250 mL) and the product is collected by filtration and dried. The product is purified by recrystallization.

EXAMPLE 3

Preparation of 1,4-bis(2,2'-Quinazolonyl)butane

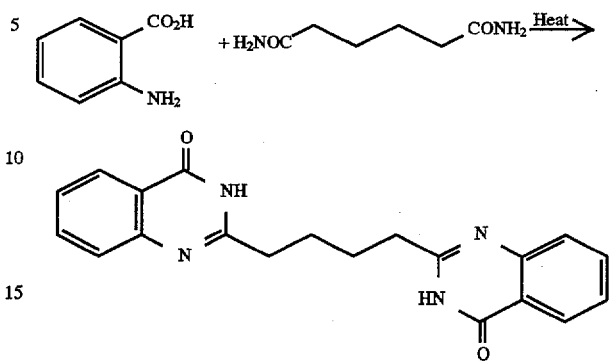

Anthranilic acid (164.5 g, 1.20 mol) is heated with adipamide (72.09 g, 0.500 mol) in dimethylacetamide (500 mL) at 150° C. (4 h). The solution is cooled and poured into water (2 L). The product is collected by filtration and dried. The product is purified by recrystallization.

EXAMPLE 4

Preparation of I From 2-(4-Fluorophenyl)-4-quinazolone

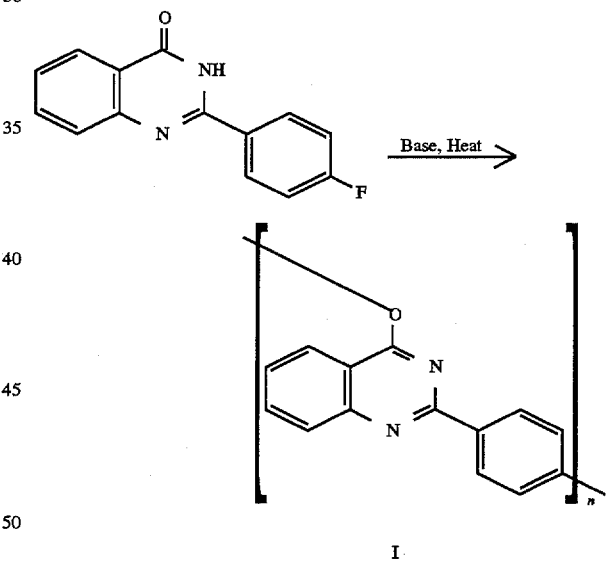

I

To a three-necked, 500 mL, round-bottomed flask are added 2-(4-fluorophenyl)-4-quinazolone (24.02 g, 100 mmol), anhydrous potassium carbonate (10.4 g, 75 mmol), NMP (210 mL), and toluene (60 mL). The flask is fitted with a mechanical stirring rod set-up, a thermometer, and a Dean Stark trap fitted with a condenser and a nitrogen inlet valve. A nitrogen atmosphere is established and the reaction is heated to reflux (16 h). The toluene and water by-product are removed from the reaction through the Dean Stark trap and the reaction is further heated to 200° C. (16 h). The reaction mixture is then cooled to room temperature and diluted with additional NMP (40 mL). The resulting mixture is poured into acetone (1 L) and the product is collected by filtration. The solid is redissolved in NMP (250 mL) and is coagulated in water (1 L). The solid is again collected by filtration. The solid is then boiled in hot acetone (1 h), filtered, and dried in a vacuum oven at 150° C. (12 H). The letter n defines the number of repeat units of the polymer and may be from 2 to 1,000,000, preferably from 10 to 10,000, and most preferably from 50 to 1000.

EXAMPLE 5

Preparation of I From 2-(4-Chlorophenyl)-4-quinazolone

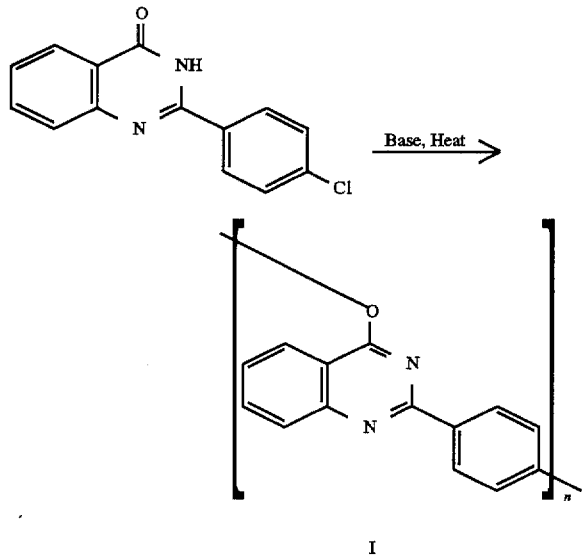

I

To a three-necked, 500 mL, round-bottomed flask is added 2-(4-chlorophenyl)-4-quinazolone (25.67 g, 100 mmol), anhydrous potassium carbonate (10.4 g, 75 mmol), NMP (210 mL), and toluene (60 mL) (the addition of a catalytic amount of a radical scavenger such as tetraphenylhydrazine can also be added to the reaction to further enhance the properties of the final polymer, see R. S. Mani, B. Zimmerman, A. Bhatnagar, and D. K. Mohanty, Polymer, 1993, 34, 171–181, and references therein). The flask is fitted with a mechanical stirring rod set-up, a thermometer, and a Dean Stark trap fitted with a condenser and a nitrogen inlet valve. A nitrogen atmosphere is established and the reaction is heated to reflux (16 h). The toluene and water by-product are removed from the reaction through the Dean Stark trap and the reaction is further heated to 200° C. (16 h). The reaction mixture is then cooled to room temperature and diluted with additional NMP (40 mL). The resulting mixture is poured into acetone (1 L) and the product is collected by filtration. The solid is redissolved in NMP (250 mL) and is coagulated in water (1 L). The solid is again collected by filtration. The solid is then boiled in hot acetone (1 h), filtered, and dried in a vacuum oven at 150° C. (12 H). The letter n defines the number of repeat units of the polymer and may be from 2 to 1,000,000, preferably from 10 to 10,000, and most preferably from 50 to 1000.

EXAMPLE 6

Preparation of II From 4-(4-Fluorophenyl)-2-quinazolone

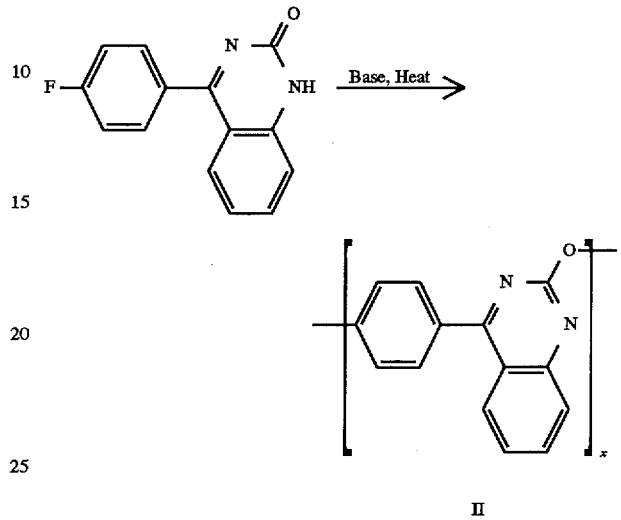

II

To a three-necked, 500 mL, round-bottomed flask is added 4-(4-fluorophenyl)-2-quinazolone (24.02 g, 100 mmol), anhydrous potassium carbonate (10.4 g, 75 mmol), NMP (210 mL), and toluene (60 mL). The flask is fitted with a mechanical stirring rod set-up, a thermometer, and a Dean Stark trap fitted with a condenser and a nitrogen inlet valve. A nitrogen atmosphere is established and the reaction is heated to reflux (16 h). The toluene and water by-product are removed from the reaction through the Dean Stark trap and the reaction is further heated to 200° C. (16 h). The reaction mixture is then cooled to room temperature and diluted with additional NMP (40 mL). The resulting mixture is poured into acetone (1 L) and the product is collected by filtration. The solid is redissolved in NMP (250 mL) and is coagulated in water (1 L). The solid is again collected by filtration. The solid is then boiled in hot acetone (1 h), filtered, and dried in a vacuum oven at 150° C. (12 H). The letter n defines the number of repeat units of the polymer and may be from 2 to 1,000,000, preferably from 10 to 10,000, and most preferably from 50 to 1000.

EXAMPLE 7

Preparation of III From 1,4-bis(2,2'-Quinazolonyl) benzene and 4,4'-Difluorobenzophenone

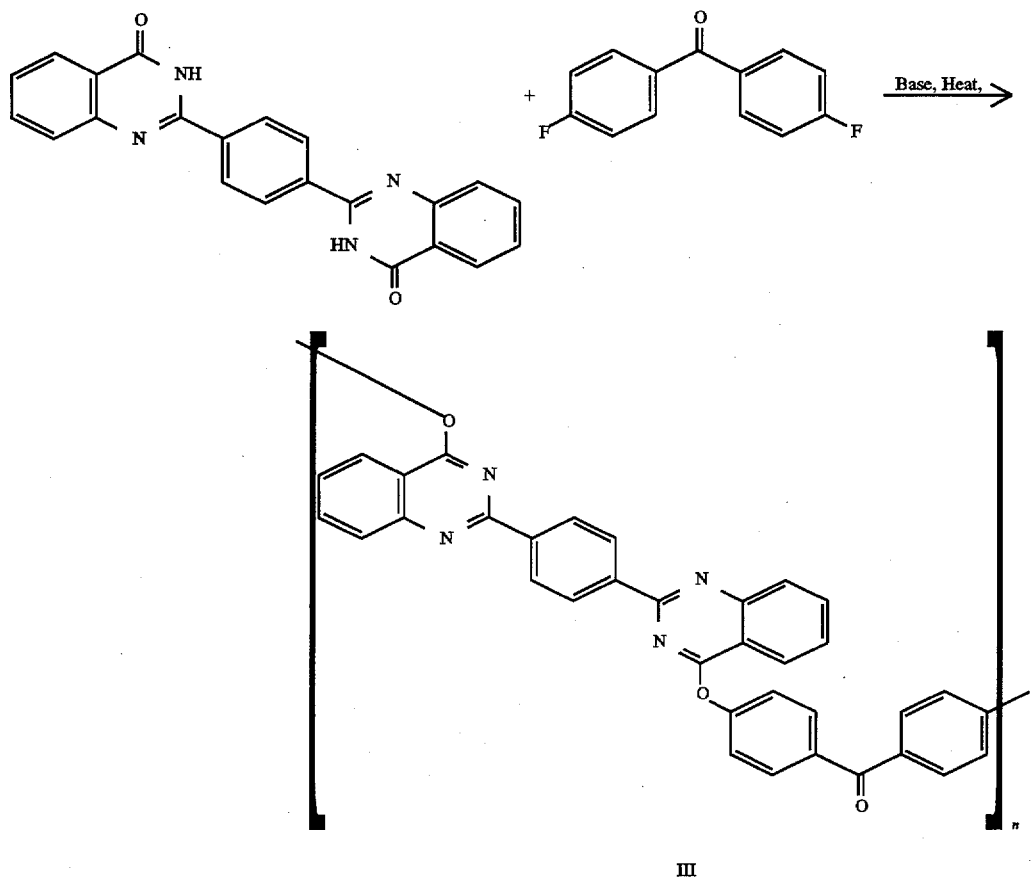

To a three-necked, 500 mL, round-bottomed flask is added 1,4-bis(2,2'-quinazolonyl)benzene (18.42 g, 50.0 mmol) and 4,4'-difluorobenzophenone (10.91 g, 50.0 mmol), anhydrous potassium carbonate (20.7 g, 150 mmol), NMP (210 mL), and toluene (60 mL). The flask is fitted with a mechanical stirring rod set-up, a thermometer, and a Dean Stark trap fitted with a condenser and a nitrogen inlet valve. A nitrogen atmosphere is established and the reaction is heated to reflux (16 h). The toluene and water by-product are removed from the reaction through the Dean Stark trap and the reaction is further heated to 200° C. (16 h). The reaction mixture is then cooled to room temperature and diluted with additional NMP (40 mL). The resulting mixture is poured into acetone (1 L) and the product is collected by filtration. The solid is redissolved in NMP (250 mL) and is coagulated in water (1 L). The solid is again collected by filtration. The solid is then boiled in hot acetone (1 h), filtered, and dried in a vacuum oven at 150° C. (12 H). The letter n defines the number of repeat units of the polymer and may be from 2 to 1,000,000, preferably from 10 to 10,000, and most preferably from 50 to 1000.

EXAMPLE 8

Preparation of IV From 1,4-bis(2,2'-Quinazolonyl) butane and bis(4-Fluorophenyl)sulfone

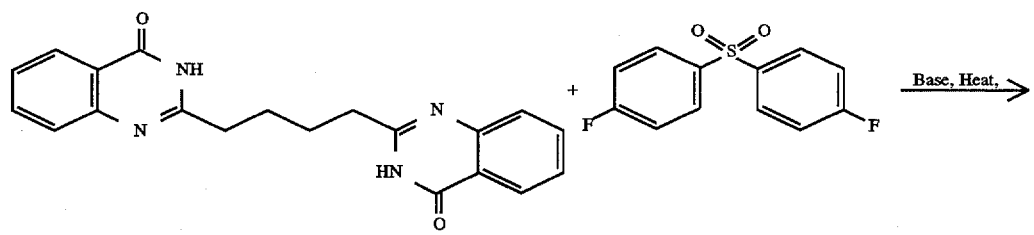

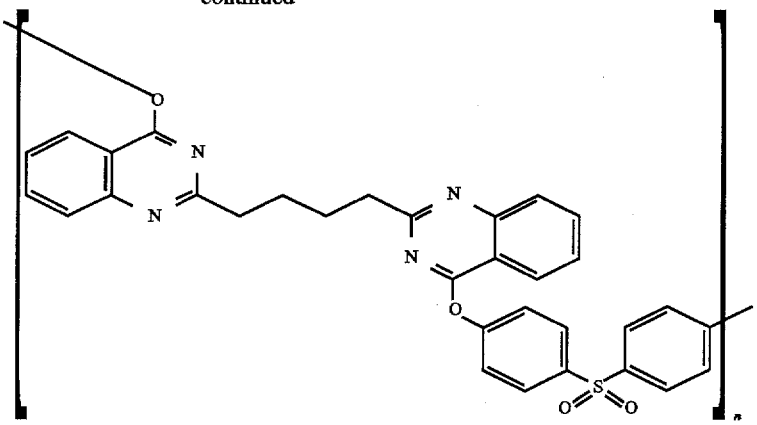

IV

To a three-necked, 500 mL, round-bottomed flask is added 1,4-bis(2,2'-quinazolonyl)butane (17.32 g, 50.0 mmol) and bis(4-fluorophenyl)sulfone (12.71 g, 50 mmol), anhydrous potassium carbonate (20.7 g, 150 mmol), NMP (210 mL), and toluene (60 mL). The flask is fitted with a mechanical stirring rod set-up, a thermometer, and a Dean Stark trap fitted with a condenser and a nitrogen inlet valve. A nitrogen atmosphere is established and the reaction is heated to reflux (16 h). The toluene and water by-product are removed from the reaction through the Dean Stark trap and the reaction is further heated to 200° C. (16 h). The reaction mixture is then cooled to room temperature and diluted with additional NMP (40 mL). The resulting mixture is poured into acetone (1 L) and the product is collected by filtration. The solid is redissolved in NMP (250 mL) and is coagulated in water (1 L). The solid is again collected by filtration. The solid is then boiled in hot acetone (1 h), filtered, and dried in a vacuum oven at 150° C. (12 H). The letter n defines the number of repeat units of the polymer and may be from 2 to 1,000,000, preferably from 10 to 10,000, and most preferably from 50 to 1000.

The polymer compositions of the present invention are generally useful in the area of electronics and microelectronics applications because of their combination of low dielectric constant, low water uptake, high thermal stability and good solubility. The instant polymers are useful for dielectric layers in integrated circuits (IC's) such as planarizers, insulators, passivation layers, encapsulants, adhesives and the like. They are also useful in various wiring board applications, such as printed wiring boards, flexible wiring boards, tape automated bonding substrates, multi-chip modules, dielectrics, other high density interconnect devices, and the like. They may also be used in fabrication of electronic components such as capacitors, resistors, discrete semiconductor devices, inductors, or other devices requiring an insulating layer.

The polymers of the present invention are also useful in electrical applications such as wire coatings and insulation, insulating lacquers, for fabricating molded connectors, switches, enclosures, insulating strips, or the like. Other applications requiring low dielectric constant and good mechanical properties are coatings applications, especially where high thermal stability and transparency are desired, and insulating applications, including conformal coatings and protective layers, potting compounds, and the like. The polymers of the present invention are also useful as adhesives, for example as die attach adhesives, optionally with fillers, or laminate adhesives. The polymers of the present invention are also useful as matrix resins for composites.

The instant polymers may also be used as free standing films, as laminated films, fibers, and coatings.

The following examples of applications for the polymers of the present invention are intended to be illustrative and are in no way limiting.

Referring to FIG. 1, a semi-schematic cross-sectional side view of a multi-chip module 10, provided in accordance with practice of the present invention, is shown. Such multi-chip modules are wiring boards designed to hold several integrated circuit chips (IC's) (not shown) directly without the IC's first being packaged into individual chip carriers. The multi-chip module is typically (but not necessarily) fabricated using photolithographic techniques similar to those used in IC fabrication. The following procedure outlining multi-chip module fabrication is illustrative and many variations are known in the art and may be used with the present invention.

A substrate 12, typically a four- or six-inch silicon or alumina wafer having a plurality of conductors 13 on its surface, is spin-coated with a layer 14 of a polyquinazoline polymer provided in accordance with the present invention. Solvent from the spin-coating process is removed in an oven, and the polyquinazoline layer is cured by heating to a selected temperature for a selected period of time as described above to enhance the solvent resistance of the polyquinazoline layer. Vias (not shown) are cut through the polymer by any of several techniques, for example, laser drilling or patterning and etching. A layer of metal 16, typically copper or aluminum, is deposited and patterned using techniques known in the art to form metal lines with a portion of the metal 16a extending through the via and contacting the conductors 13. A second layer of polyquinazoline 18 provided in accordance with the present invention is spin-coated, dried and cured, completely covering the underlying metal. Vias are cut as above, and a second layer of metal is deposited and patterned. Additional layers of polymer 20 and metal 22 are added by repeating the above procedure. In some processes, it may be desirable to use adhesion promoters to enhance adhesion of the polymer to the silicon substrate or subsequent layers, or to plate the metal lines with chromium or gold before the application of the polymer.

The polymers of the present invention are also useful as dielectric materials in other passive or active discrete electronic components, such as capacitors, resistors, inductors, transformers, diodes, transistors and the like.

Referring to FIG. 2, a semi-schematic exploded view of a capacitor 30 is shown. Dielectric films 32, and 34, comprising a polyquinazoline polymer provided in accordance with practice of the present invention, insulate metal foils 36, and 38, which form the plates of the capacitor. The multi-layer structure is typically wound into a roll 40, and packaged after providing electrical connections (not shown).

The polymers of the present invention may also be used in coating applications such as liquid crystal displays, flat panel TV, light valves, solar windows, and the like. The instant polymers are also useful in optic and electro-optic applications such as optical wave guides, optical fibers, and non-linear optical devices. Electrical applications include wire coatings and wire wrap film, protective and anticorrosion coatings, as resin for connectors, housing, switches, plugs, sockets, or other molded electrical components.

The polymers of the present invention are also useful as interlayer dielectrics for integrated circuits. The low dielectric constant and high thermal stability are advantageous in interlayer dielectric applications. The interlayer dielectric separates the signal-carrying metal layers from each other and/or from the semi-conductor devices of the integrated circuit.

Turning to FIG. 3, there is shown a schematic view of an integrated circuit 42, comprising a semi-conducting device 43, integrated into a silicon wafer 45, metal signal-carrying lines 47, and a polyquinazoline polymer provided in accordance with practice of the present invention serving as insulating dielectric layers 44. The polyquinazoline layers are fabricated using techniques commonly known in the art, including spin-coating followed by curing at elevated temperature.

The polyquinazoline polymers of the present invention are also useful as coatings where high transmission to visible light is desired. Coatings for use in other harsh environments, such as industrial, petrochemical, chemical, are also applications of the instant polymers.

The polyquinazoline polymers of the present invention may also be formed into fibers, by methods known in the art, such as wet spinning, dry spinning, and extrusion, and subject to further treatments such as hot or cold drawing.

Turning to FIG. 4, there is shown a semi-schematic view of a multi-filament fiber 50, comprising a plurality of mono-filaments 52 of a polyquinazoline polymer, provided in accordance with the present invention.

High strength, thermally stable films, optionally uniaxially oriented, may be prepared from the polyquinazoline polymers of the present invention.

Figure 5:
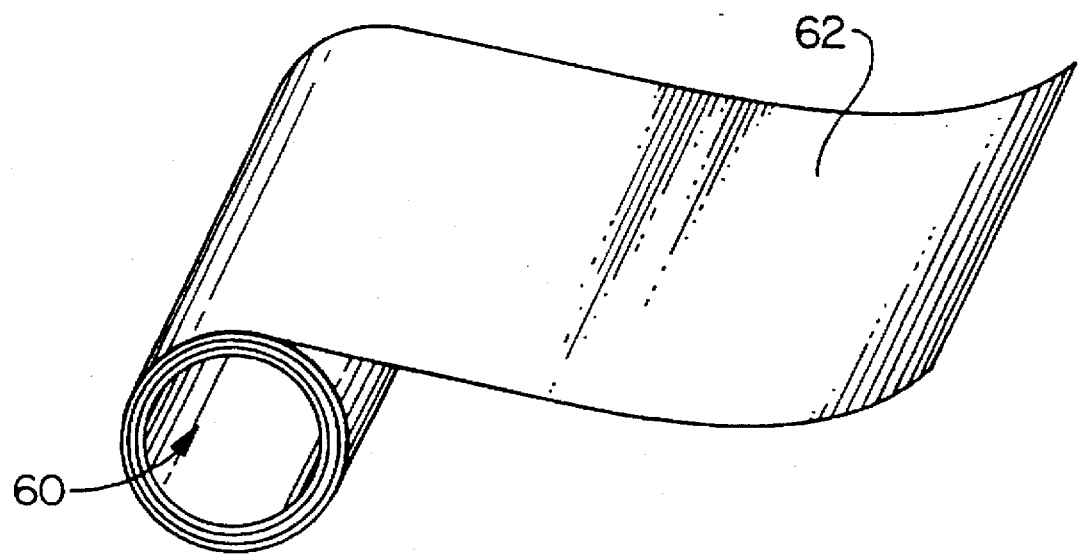
FIG. 5 is a semi-schematic perspective view of a roll of free-standing film provided in accordance with practice of the present invention.

Turning to FIG. 5, there is shown a roll 60 of free-standing film 62, formed from a polyquinazoline polymer prepared in accordance with practice of the present invention.

The above-described fibers and films have various uses, including textiles, cord, rope, fibers for use in composites, barrier films, bagging material, electrical and thermal insulation, and release films.

The polymers of the present invention may also be used as matrix resins for composites applications.

The above description of preferred embodiments of polyquinazoline polymers and the monomers useful for forming the polymers are for illustrative purposes. Because of variations which will be apparent to those skilled in the art, the present invention is not intended to be limited to the particular embodiments described above, The invention disclosed herein may suitably be practiced in the absence of any material or composition which is not specifically disclosed herein. The scope of the invention is defined in the following claims.

What is claimed is:

1. A method for preparing a polyquinazoline polymer comprising treating a monomer comprising a quinazolone nucleus having one activated halide group with a base in a dipolar solvent to thereby form said polyquinazoline polymer.

2. The method according to claim 1, wherein the monomer is 2-(4-fluorophenyl)quinazolone.

3. The method according to claim 1, wherein the monomer is 2-(4-chlorophenyl)quinazolone.

4. The method according to claim 1, wherein the monomer has the following structure:

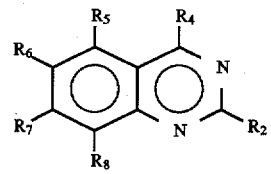

where one of $R_2$ and $R_4$ is OH, and one of $R_2$, $R_4$, $R_5$, and $R_7$ is selected from the group consisting of halide, ortho-arylhalide, and para-arylhalide, wherein unfilled $R_2$, $R_4$, $R_5$, $R_6$, $R_7$ and $R_8$ positions on the quinazolone nucleus are independently selected from the group H or $R(_n)$, wherein $R(_n)$ is any R group not interfering with the polymerization reaction.

5. The method according to claim 1, wherein two or more different quinazolone monomers are used to thereby form a polyquinazoline co-polymer.

6. A method according to claim 1, wherein treating of the monomer with the base comprises heating a mixture of the monomer and base in the dipolar solvent to a reflux temperature of the mixture and azeotropically removing water.

7. A method according to claim 6, further comprising, after removal of the water, removing the solvent by distillation and then heating the resulting mixture to a reflux temperature until the polyquinazoline polymer is formed.

* * * * *